(12) United States Patent
Janssens

(10) Patent No.: US 10,084,039 B2
(45) Date of Patent: Sep. 25, 2018

(54) SEMICONDUCTOR DEVICE HAVING SELF-ISOLATING BULK SUBSTRATE AND METHOD THEREFOR

(71) Applicant: SEMICONDUCTOR COMPONENTS INDUSTRIES, LLC, Phoenix, AZ (US)

(72) Inventor: Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 12 days.

(21) Appl. No.: 15/659,450

(22) Filed: Jul. 25, 2017

(65) Prior Publication Data
US 2017/0338304 A1    Nov. 23, 2017

Related U.S. Application Data

(63) Continuation of application No. 15/140,152, filed on Apr. 27, 2016, now Pat. No. 9,748,330.
(Continued)

(51) Int. Cl.
*H01L 29/78*    (2006.01)
*H01L 27/08*    (2006.01)
(Continued)

(52) U.S. Cl.
CPC ........ *H01L 29/0646* (2013.01); *H01L 23/552* (2013.01); *H01L 27/0623* (2013.01);
(Continued)

(58) Field of Classification Search
CPC ..... H01L 29/06; H01L 29/063; H01L 29/064; H01L 29/0646; H01L 29/10;
(Continued)

(56) References Cited

U.S. PATENT DOCUMENTS

| | | |
|---|---|---|
| 7,095,092 B2 | 8/2006 | Zhu et al. |
| 7,989,875 B2 | 8/2011 | Noort et al. |

(Continued)

OTHER PUBLICATIONS

Lijuan et al., A high voltage SOI pLDMOS with a partial interface equipotential floating buried layer, Journal of Semiconductors, Jul. 2013, 074009-1 thru 074009-5, vol. 34, No. 7.
(Continued)

*Primary Examiner* — Monica D Harrison
(74) *Attorney, Agent, or Firm* — Kevin B. Jackson

(57) ABSTRACT

A semiconductor device comprises a bulk semiconductor substrate that includes a first conductivity type floating buried doped region bounded above by a second conductivity type doped region and bounded below by another second conductivity semiconductor region. Trench isolation regions extend through the second conductivity doped region and the first conductivity floating buried doped region into the semiconductor region. Functional devices are disposed within the second conductivity type doped region. The first conductivity type floating buried doped region is configured as a self-biased region that laterally extends between adjacent trench isolation regions.

20 Claims, 6 Drawing Sheets

Related U.S. Application Data

(60) Provisional application No. 62/277,326, filed on Jan. 11, 2016.

(51) Int. Cl.
*H01L 29/06* (2006.01)
*H01L 27/06* (2006.01)
*H01L 27/092* (2006.01)
*H01L 27/088* (2006.01)
*H01L 23/552* (2006.01)
*H01L 29/10* (2006.01)

(52) U.S. Cl.
CPC ........ *H01L 27/088* (2013.01); *H01L 27/0922* (2013.01); *H01L 29/063* (2013.01); *H01L 29/0649* (2013.01); *H01L 29/1087* (2013.01); *H01L 29/7816* (2013.01)

(58) Field of Classification Search
CPC ... H01L 29/108; H01L 29/1087; H01L 29/78; H01L 29/781; H01L 29/7816; H01L 27/06; H01L 27/062; H01L 27/0623; H01L 27/08; H01L 27/088; H01L 27/09; H01L 27/092; H01L 27/0922; H01L 23/55; H01L 23/552
USPC ........................................................ 257/337
See application file for complete search history.

(56) References Cited

U.S. PATENT DOCUMENTS

| | | |
|---|---|---|
| 8,138,531 B2 | 3/2012 | Adkisson et al. |
| 8,264,038 B2 | 9/2012 | Pendharkar et al. |
| 8,338,872 B2 | 12/2012 | Khemka et al. |
| 9,748,330 B2 * | 8/2017 | Janssens ............... H01L 23/552 |
| 2015/0002967 A1 | 1/2015 | Kawase et al. |

OTHER PUBLICATIONS

Kia et al., A novel partial-SOI LDMOSFET (>800 V) with n-type floating buried layer in substrate, Microelectronics Reliability, 54, 2014, pp. 582-586, www.elsevier.com/locate/microrel.

* cited by examiner

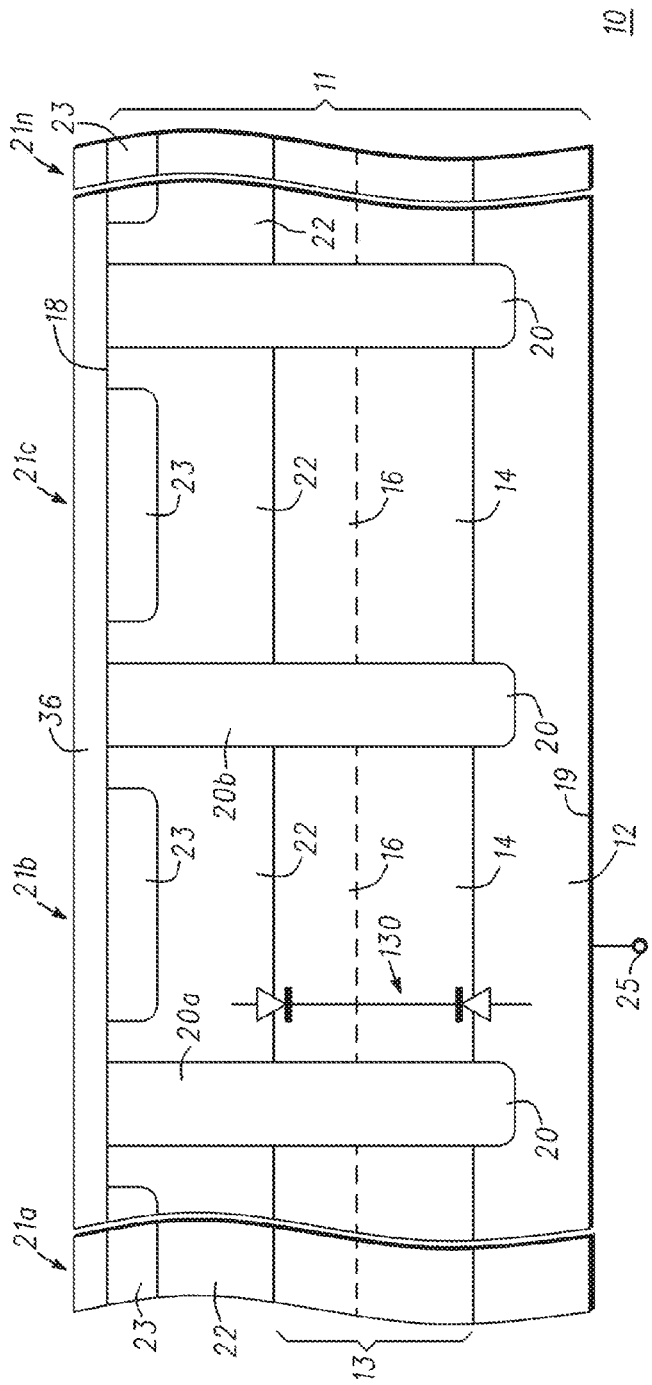
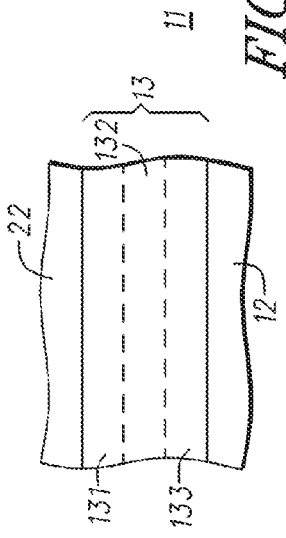

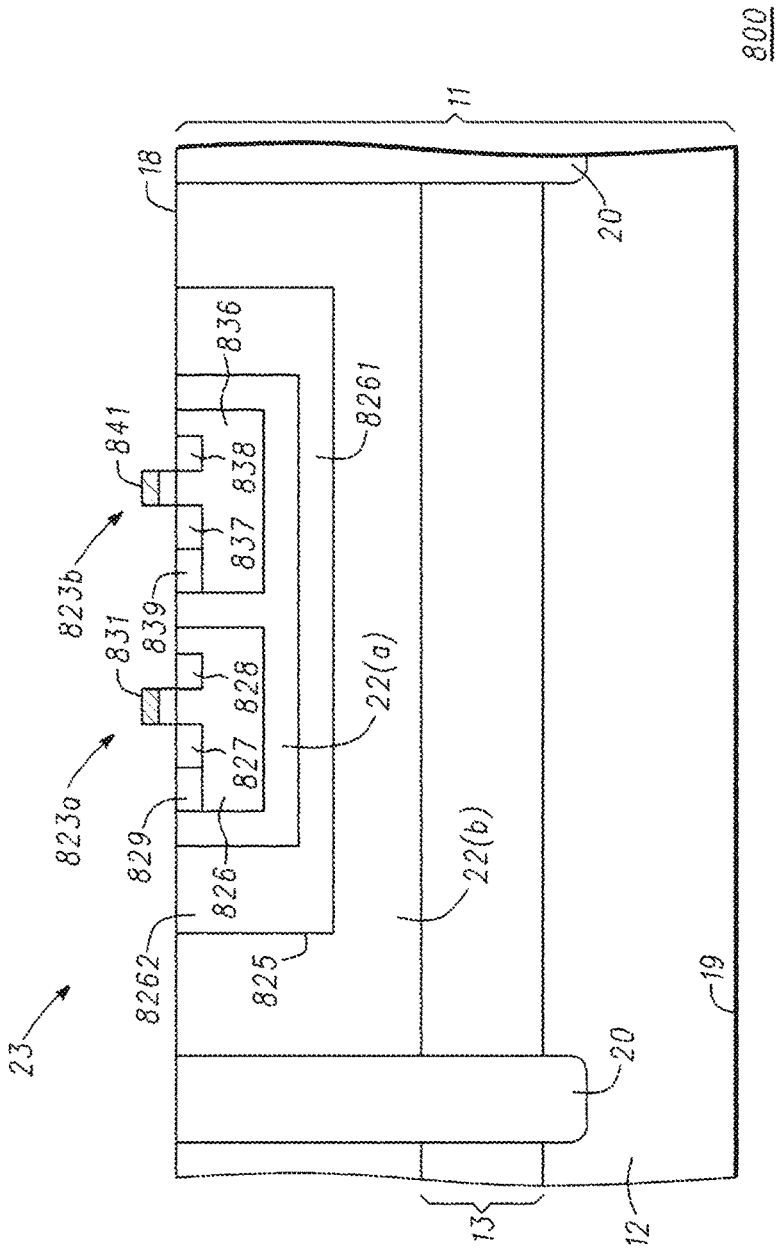

SEMICONDUCTOR DEVICE HAVING SELF-ISOLATING BULK SUBSTRATE AND METHOD THEREFOR

CROSS-REFERENCE TO RELATED APPLICATIONS

The present application is a continuation application of U.S. patent application Ser. No. 15/140,152 filed on Apr. 27, 2016 and issued as U.S. Pat. No. 9,748,330, which claims the benefit of priority from U.S. Provisional Application No. 62/277,326 filed on Jan. 11, 2016, both of which are incorporated by reference herein and priority thereto is hereby claimed.

BACKGROUND

The present invention relates, in general, to electronics and, more particularly, to semiconductor device structures and methods of forming semiconductor devices.

Integrated circuits have been classified as analog devices, digital devices, or power devices. Smart Power technologies combine or integrate analog and digital circuits with power devices on or within a single semiconductor substrate. The smart part of the smart power circuit adds, for example, control, diagnostic, and protection functions to the power semiconductor devices. Smart Power technologies have increased the robustness and reliability of power drivers for automotive and industrial applications. Such applications have included, for example, intelligent power switches for controlling an ABS-braking system, system power chips for airbag control, engine management, motor control, switched mode power supplies, intelligent switching of lights, among others.

The integration of logic and analog functions with power transistors on a single semiconductor die presents challenges in the isolation schemes used to physically separate and electrically isolate the different functional devices. Such isolation schemes have included, for example, junction isolation and dielectric isolation schemes. Dielectric isolation schemes have included dielectric trench isolation, which separates components in a lateral direction, but not against the substrate, as well as semiconductor-on-insulator ("SOI") schemes that provide both lateral isolation and vertical substrate isolation. Another isolation scheme has combined dielectric trench isolation with junction isolation regions that have been disposed adjoining the trench isolation regions within the active regions of the device.

However, the above noted isolation schemes have several shortcomings. For example, junction isolation schemes include doped regions that consume lateral space within the semiconductor chip, which results in larger chips sizes being used to ensure sufficient lateral spacing to sustain breakdown characteristics. Also, because of the larger area taken up by junction isolation schemes, junction isolation schemes also tend to exhibit undesirable high capacitance. SOI technologies provide for reduced chips sizes, but have had issues with thermal dissipation, high on-resistance due to larger average junction temperature, less robustness during inductive clamping, and lower energy capability during an electro-static discharge ("ESD") event, among others. In addition, in high voltage SOI technology, the parasitic capacitance per unit area of the top layer towards the underlying substrate often exceeds the capacitance per unit area presented by vertical junction isolation. Additionally, SOI technologies are expensive to manufacture.

Accordingly, it is desirable to have an isolation structure and a method of forming the semiconductor devices using the isolation structure that overcomes the shortcomings of prior isolation techniques set forth previously. It is also desirable for the structure and method to support the integration of low voltage and high voltage devices within a single semiconductor chip, to support both a positive bias and a negative bias versus the potential of the bulk substrate in order to increase design flexibility and enhance device performance under adverse operating conditions, to have manageable parasitics, and to have lower manufacturing costs.

BRIEF DESCRIPTION OF THE DRAWINGS

FIG. 1 illustrates an enlarged partial cross-sectional view of one embodiment of a semiconductor device in accordance with the present invention;

FIG. 2 illustrates an enlarged partial cross-sectional view of another embodiment of a semiconductor device in accordance with the present invention;

FIG. 8 illustrates an enlarged partial cross-sectional view of another embodiment of a semiconductor device in accordance with the present invention.

Figure 3:
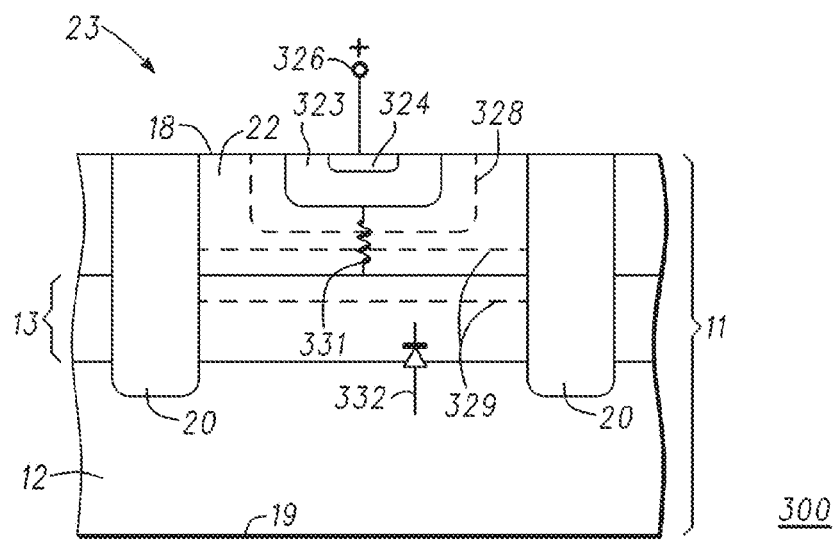
FIG. 3 illustrates an enlarged partial cross-sectional view of a further embodiment of a semiconductor device in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a semiconductor device structure comprising a self-isolating bulk semiconductor substrate. The substrate includes a floating buried doped region of a first conductivity type disposed between a doped region of a second conductivity type and a semiconductor region of the second conductivity type. The floating buried doped region abuts or adjoins a trench isolation structure that together with the floating buried doped region electrically isolates the doped region. Functional devices are disposed in the doped region. The bulk semiconductor substrate is provided without ohmic or low ohmic contact structures directly physically contacting the floating buried doped region. Among other things, the bulk semiconductor substrate reduces the area consumption of previous structures and exhibits improved thermal and electrical performance compared to previous structures.

In one embodiment, a semiconductor device structure comprises a self-isolating bulk semiconductor substrate having first and second opposing major surfaces. The self-isolating bulk semiconductor substrate includes a floating buried doped region of a first conductivity type, a doped region of a second conductivity type disposed between the floating buried doped region and the first major surface, and a semiconductor region of the second conductivity type disposed between the floating buried doped region and the second major surface. A trench isolation region extends from the first major surface through the doped region, extends through the floating buried doped region, and extends into the semiconductor region, wherein the floating buried doped region abuts the trench isolation region. A semiconductor device is disposed within the doped region. In one embodiment the semiconductor device structure is configured as a smart power semiconductor device structure.

In another embodiment, a semiconductor device structure comprises a bulk semiconductor substrate having first and second opposing major surfaces. The bulk semiconductor substrate comprises a floating buried doped region of a first conductivity type, a doped region of a second conductivity type disposed between the floating buried doped region and the first major surface; and a semiconductor region of the second conductivity type disposed between the floating buried doped region and the second major surface, wherein the doped region and the semiconductor region are provided absent any diffused contact structures or conductive contact structures making direct or low-ohmic contact to the floating buried doped region. A pair of laterally separated isolation trenches extends from the first major surface through the doped region, extends through the floating buried doped region, and extends into the semiconductor region, wherein the floating buried doped region abuts the pair of laterally separated isolation trenches. A semiconductor device is disposed within the doped region between the least one pair of laterally separated isolation trenches.

In a further embodiment, a semiconductor device structure comprises a self-isolating bulk semiconductor substrate having first and second opposing major surfaces. The self-isolating bulk semiconductor substrate comprises a floating buried doped region of a first conductivity type, a doped region of a second conductivity type disposed between the floating buried doped region and the first major surface, and a semiconductor region of the second conductivity type disposed between the floating buried doped region and the second major surface, wherein the doped region and the semiconductor region are provided absent any diffused contact structures or conductive contact structures making direct or low-ohmic contact to the floating buried doped region. A trench isolation structure extends from the first major surface through the doped region, extends through the floating buried doped region, and extends into the semiconductor region, wherein the trench isolation structure comprises a plurality of trench isolation portions in cross-sectional view, and wherein the floating buried doped region abuts trench isolation portion, and wherein the floating buried doped region abuts each of isolation trenches, wherein the trench isolation structure defines a plurality of device active regions within the doped region. A plurality of semiconductor devices is disposed within the device active regions.

FIG. 1 illustrates an enlarged partial cross-sectional view of a device 10, an electronic device 10, a semiconductor device structure 10, or a semiconductor device 10 having a self-isolating bulk semiconductor substrate 11 or self-isolating bulk semiconductor region 11. In accordance with the present embodiment, semiconductor substrate 11 is configured to have improved thermal conductivity compared SOI substrates, and improved device density and performance compared to bulk substrates using lateral junction isolation structures and/or doped sinker structures. In one embodiment, semiconductor device 10 is configured as a smart power semiconductor device including analog, digital, and power functionality integrated within (e.g., including on and in) semiconductor substrate 11. In the present embodiment, semiconductor substrate 11, which includes a major surface 18 and an opposing major surface 19, includes a p-type semiconductor region 12 or PSUB wafer 12. In one embodiment, semiconductor region 12 is a silicon region or wafer doped with boron, and has a dopant concentration in range from about $4.0 \times 10^{18}$ atoms/cm$^3$ to about $1.0 \times 10^{19}$ atoms/cm$^3$ or more. It is understood that semiconductor region 12 can comprise a plurality of p-type layers of different dopant concentration. Additionally, it is understood that semiconductor region 12 can include other types of materials including, but not limited to, heterojunction semiconductor materials. In accordance with the present embodiment, semiconductor region 12 is configured to be connected to a potential (denoted generally by node 25) or configured to be a floating region (i.e., no ohmic or low-ohmic external voltage is imposed on semiconductor region 12).

Semiconductor substrate 11 further includes a doped region 22, doped layer 22, or doped pockets 22 extending from major surface 18. In one embodiment, doped region 22 can be a p-type conductivity region or layer and can be formed using epitaxial growth techniques, ion implantation and diffusion techniques, or other methods as known to those of ordinary skill in the art. In some embodiments doped region 22 has a dopant concentration in a range from about $1.0 \times 10^{15}$ atoms/cm$^3$ to about $1.0 \times 10^{16}$ atoms/cm$^3$. In one embodiment, doped region 22 has a dopant concentration of about $3.0 \times 10^{15}$ atoms/cm$^3$. It is understood that the dopant concentration of doped region 22 as well as its thickness is adjusted in accordance with the desired characteristics of the functional devices formed within semiconductor substrate 11. In another embodiment, doped region 22 can have a graded dopant profile. In a further embodiment, doped region 22 comprises a plurality of p-type layers of different dopant concentration. In a still further embodiment, doped region 22 has a substantially uniform dopant concentration in a direction substantially perpendicular to major surface 18.

In accordance with the present embodiment, semiconductor substrate 11 further includes a floating buried or subsurface doped region 13, floating buried doped layer 13, or separation layer 13 disposed between semiconductor region 12 and doped region 22. In one embodiment, floating buried doped region 13 is configured to include an n-type layer 14 or buried doped region 14 and an n-type buried layer 16 or buried region 16. In another embodiment, floating buried doped layer 13 includes only buried region 16.

In accordance with the present embodiment, floating buried doped region 13 is an electrically floating region, which means that no ohmic or low-ohmic external voltage is imposed on floating buried doped region 13. More particularly, semiconductor substrate 11 and device 10 are configured without any conductive or doped semiconductor structures providing an ohmic or highly doped contact or direct electrical pathway to buried layer 16. Stated another way, doped region 22 and semiconductor region 12 are formed or provided absent any diffused contact structures or conductive contact structures making direct or low-ohmic contact to floating buried doped region 13. Stated a different way, doped region 22 and semiconductor region 12 are configured so that no low-ohmic external voltage is imposed on floating buried doped region 13. In a preferred embodiment, floating buried doped region 13 extends laterally all the way or entirely across semiconductor substrate 12 between adjacent isolation regions 20. Stated another way, floating buried doped region 13 completely vertically separates doped region 22 from semiconductor region 12 with no portion of doped region 22 directly contacting semiconductor region 12. In one preferred embodiment, floating buried doped region 13 functions together with trench isolation regions 20 to provide one or more electrically isolated doped regions 22 for device 10. More particularly, the present embodiment uses a back-to-back (i.e., anti-series) diode configuration 130 between p-type doped region 22, n-type floating buried doped region 13, and p-type semiconductor region 12 as part of a preferred isolation scheme, structure, or configuration.

Unlike previous devices, semiconductor substrate 11 and device 10 are configured without doped sinker regions extending from major surface 18 to n-type floating buried doped region 13 where the doped sinker regions and n-type floating buried doped region 13 have the same conductivity type and directly contact each other. Further, unlike previous devices, semiconductor substrate 11 and device 10 are provided absent or without any laterally extending buried oxides or SOI structures that partially or completely vertically separate doped regions 22 from semiconductor region 12. Prior to this disclosure, it was believed that in order to have p-type doped regions 22 on top of a p-type semiconductor region 12 it was required to either provide n-type sinkers extending from major surface 18 to the buried layer to provide necessary isolation for the functional devices within doped region 22 and/or to define the potential of the buried layer; or to use a buried oxide isolation or SOI isolation scheme between doped regions 22 and semiconductor region 12. However, the author of the present disclosure found that this is not the case and that the potential of n-type floating buried doped region 13 can electrically configure itself so as to form an electrical barrier between doped region 22 and semiconductor region 12.

FIG. 2 illustrates a partial cross-sectional view of a portion of semiconductor substrate 11 in accordance with one preferred embodiment. In this embodiment, floating buried doped region 13 has a varying dopant profile or varying dopant concentration designated for example, as regions or portions 131, 132, and 133. Since floating buried region 13 does not have to make a low-ohmic contact to a contact structure (e.g., a diffused contact or trench contact), it is not important for region 131 (i.e., the region that adjoins doped region 22) of floating buried doped region 13 to be of a high dopant concentration (e.g., does not have to doped greater than $1.0 \times 10^{19}$ atoms/cm$^3$). This allows for region 131 of floating buried doped region 13 to have a lower dopant concentration, which beneficially facilitates the optimization of junction breakdown (e.g., provides lower electric field in region 131 of floating buried doped region 13) or depletion region reach-through (e.g., provides lower penetration of space charge regions within doped region 22) characteristics of the functional devices integrated within doped region 22. In a further preferred embodiment, region 132 of floating buried doped region 13 has a higher dopant concentration than region 131, which beneficially facilitates the control of parasitics within device 10. For example region 132 facilitates the elimination of or reduces the effects of the base region of a parasitic vertical PNP transistor formed by doped region 22, floating buried doped region 13 and semiconductor region 12. In one embodiment, region 133 of floating buried doped region 13 has a lower dopant concentration than region 132 and a lower dopant concentration than region 131. It is understood that the thicknesses of each of the regions 131-133 can be different or the same depending on the performance requirements of device 10.

By way of example, region 131 has a dopant concentration in a range from about $1.0\times10^{15}$ atoms/cm$^3$ to about $1.0\times10^{17}$ atoms/cm$^3$; region 132 has a dopant concentration in a range from about $1.0\times10^{17}$ atoms/cm$^3$ to about $1.0\times10^{19}$ atoms/cm$^3$; and region 133 has a dopant concentration in a range from about $1.0\times10^{15}$ atoms/cm$^3$ to about $1.0\times10^{17}$ atoms/cm$^3$. In another embodiment, floating buried doped region 13 has graded dopant profile. In a further embodiment, floating buried doped region 13 has a substantially constant dopant concentration. Floating buried doped region 13 can be doped with one or more of phosphorous, arsenic, or antimony. In one embodiment of floating buried doped region 13 using doped region 14 and buried layer 16, doped region 14 has a thickness/depth in a range from about 12 microns to about 18 microns, and buried layer 16 has a thickness/depth in a range from about 3 microns to about 5 microns.

In some embodiments, floating buried doped region 13 has an as-formed dopant profile formed using epitaxial growth techniques. In other embodiments, floating buried doped region 13 and doped region 22 can be formed together using epitaxial growth techniques. In some embodiments, floating buried doped region 13 can be formed using ion implantation and diffusion techniques or other techniques as known to those of ordinary skill in the art. In one embodiment, a portion of floating buried doped region 13 is formed using epitaxial growth techniques and another portion of floating buried doped region 13 can formed using ion implantation techniques. The implanted dopant can be diffused separately or during the epitaxial growth process for forming doped region 22.

Device 10 further includes isolation structures 20, dielectric isolation structures, 20, trench isolations structures, or trench isolation regions 20 extending from major surface 18 downward or substantially vertically into region 12 of semiconductor material 11. Isolation structures 20 are configured to laterally isolate, both physically and electrically, adjacent device active regions or pockets 21 (further designated as 21a-21n) within semiconductor substrate 11 where functional devices 23 are fabricated. Stated another way, trench isolation regions 20 are configured to laterally isolate, both physically and electrically, layer 22 of a given pocket from any adjacent layers 22 belonging to adjacent pockets, and to isolate doped region 13 of a given pocket from any adjacent doped regions 13 belonging to adjacent pockets. Functional devices 23 include, for example, power metal-oxide semiconductor ("MOS") devices, such as LDMOS devices, diode devices, complementary MOS ("CMOS") and/or bipolar logic devices, CMOS and/or bipolar analog devices, sensor devices, bipolar power transistor devices, insulated gate bipolar transistor ("IBGT") power devices, thyristors power devices, other power devices, and other similar semiconductor devices as known to those of skill in the art. It is understood that multiple functional devices 23, and multiple types of devices 23, may be instantiated inside the doped region 22 within the confines of a given pocket 21a-21n delineated by trench isolation regions 20. Stated another way, a pocket may include multiple functional devices 23, as is common practice in smart power technologies.

In one embodiment, isolation structures 20 can be deep trench isolation structures formed using deep reactive ion etching (DRIE) techniques and can be filled or lined using one or more dielectric materials. In another embodiment, the trenches are lined with a combination of a dielectric liner and polycrystalline semiconductor material. In one embodiment, device 10 includes an insulating layer or layers 36 on or overlying major surface 18 and is formed having pre-selected openings (not shown) for providing contact regions to functional devices 23. In one embodiment, insulating layer 36 can be an oxide material. One or more conductive interconnect structures and one or more interlayer dielectric ("ILD") structures can be incorporated (not shown) to provide input/output signals to device 10 and to interconnect the various functional devices 23. In one embodiment, isolation structure 20 is an interconnected continuous isolation structure. In another embodiment, isolation structure 20 is a plurality of individual isolation structures. In accordance with the present embodiment, isolation structure 20 is configured to provide at least one or more pairs (e.g., 20a and 20b) of laterally separated isolation trenches in cross-sectional view as generally illustrated, for example, in FIG. 1.

In accordance with the present embodiment, self-isolating bulk semiconductor substrate 11 advantageously provides a bulk substrate configuration that has the compactness or circuit density of SOI substrates compared to substrates using diffused sinker structures, has improved thermal performance compared to SOI substrates, enables reduced coupling between device pockets 21 and semiconductor region 12, and has a significantly lower substrate cost compared to SOI substrates—at least 30% lower in comparative base substrate cost. Also, functional devices 23 disposed within doped regions 22 can freely float positive and negative versus the potential of semiconductor region 12. Additionally, the self-biasing aspect of floating buried doped region 13 enables the PNP vertical transistor (or back-to-back diode 130) to function as if semiconductor substrate 11 was an SOI-like substrate without the associated disadvantages of SOI. In addition, because semiconductor substrate 11 and device 10 is provided without diffused sinker regions or other direct contact structures, the lateral distance between isolation structures 20 and functional device 23 can be reduced or even eliminated to provide active area gains (similar to SOI substrates), which reduces costs significantly. Further, semiconductor substrate 11 and device 10 in cross-sectional view comprises semiconductor material and therefore does not have the thermal disadvantages associated with SOI substrates (i.e., thermal resistances reduced or substantially eliminated). Moreover, semiconductor substrate 11 is manufactured using available epitaxial growth, ion implantation, and/or diffusion techniques, which provides for cost effective manufacturing.

In accordance with the present embodiment, floating n-type doped region 13 is configured as a self-biased region because there is no direct external electrical potential applied to it. Any potential received by n-type floating buried doped region 13 results from adjoining junctions with p-type regions 22 and p-type semiconductor region 12. In accordance with one example theory of operation, the potential on n-type floating doped region 13 (as well as any n-type material adjoining floating n-type doped region 13) is believed to be primarily determined as follows. Assuming minimal current flowing into the p-type doped region 22/n-type floating buried doped region 13 junction and the p-type semiconductor region 12/n-type floating buried doped region 13 junction, the DC potential of n-type floating buried doped region 13 will converge to the maximum potential between doped region 22 and semiconductor region 12. Due to various leakage sources, the floating buried doped region 13 potential may deviate by one forward voltage drop from the maximum potential found on any two adjacent p-type anodes, which means n-type floating buried doped region 13 is dynamically biased by the adjacent p-type layers. When doped region 22 is at a positive potential versus semiconductor region 12, floating buried doped region 13 follows the doped region 22 potential (factoring in a potential forward diode voltage) and can go as high as the breakdown voltage limit between floating buried doped region 13/semiconductor region 12 junction. Alternatively, when doped region 22 is negative versus semiconductor region 12, floating buried doped region 13 is clamped to the semiconductor region 12 potential (minus a forward voltage), and the doped region 22 potential can go as low as the breakdown voltage or punch-through limit between doped region 22 and floating buried doped region 13. Also, when more than one doped region 22 (i.e., more than one pocket 21) is included within device 10, the potential of floating buried doped region 13 within a given pocket will be the maximum potential of doped region 22 for that pocket and semiconductor substrate 12. Stated another way, there is no DC constraint imposed between pockets 21a-21n. One doped region 22 within a first pocket 21b can go negative while another doped region 22 within a second pocket 21c can go positive at the same time without necessarily reaching the breakdown limits of device 10.

The above theory of operation is applicable when semiconductor region 12 is configured to be connected to a potential (denoted generally by node 25 in FIG. 1) or configured to be a floating region. In the former case, the equilibrium potential on the n-type floating buried doped region 13 within a given pocket is determined by the potential 25 applied to semiconductor substrate 12 and the potential of doped region 22 for that given pocket. Stated another way, the equilibrium potential on the n-type floating buried doped region 13 of a given pocket is substantially independent from the potential on the n-type floating buried doped region 13 of any other pocket. In the latter case, floating semiconductor region 12 acts as an intermediary node between the n-type floating buried doped regions 13 of pockets 21a-21n. Stated another way, through interaction with floating semiconductor region 12, the potential on the n-type floating buried doped region 13 of a given pocket can modify the potential on the n-type floating buried doped region 13 of other pockets.

FIG. 3 illustrates an enlarged partial cross-sectional view of a device 300, semiconductor device structure 300, or semiconductor device 300 using self-isolating bulk semiconductor substrate 11 in accordance with an embodiment configured to illustrate a punch-through or reach-through effect. In this embodiment, functional device 23 is illustrated as an n-type region 323 and an n-type contact region 324 disposed within n-type region 323. With a positive bias 326 placed on n-type region 323, a depletion region 328 extends into p-type doped region 22 towards n-type floating buried doped region 13, and a depletion region 329 extends upward into p-type doped region 22 from n-type floating buried doped region 13. When depletion region 328 touches depletion region 329, a resistive path 331 is created towards n-type floating buried doped region 13, which is blocked by diode 332 formed between n-type floating buried doped region 13 and p-type semiconductor region 12, and that functions to pull the potential of n-type floating buried doped region 13 towards the potential of positive bias 326. Stated another way, device 300 provides a way to bootstrap the potential of n-type floating buried doped region 13 towards the positive bias 326, ensuring that the potential of n-type floating buried doped region 13 stays within a punch-though voltage from 326. In accordance with the present embodiment, FIG. 3 illustrates some design parameters that can be used to design functional devices 23, including the thickness of p-type doped region 22, the dopant concentration and profile of p-type doped region 22, the dopant concentration and profile of n-type floating buried doped region 13, and the dopant concentration of p-type semiconductor region 12, among others. It is understood that multiple functional devices 23, and multiple types of functional devices 23, may be instantiated inside or incorporated within the doped region 22 within the confines of a given pocket delineated by trench isolation regions 20. Stated another way, each pocket may incorporate multiple functional devices 23.

Figure 4:
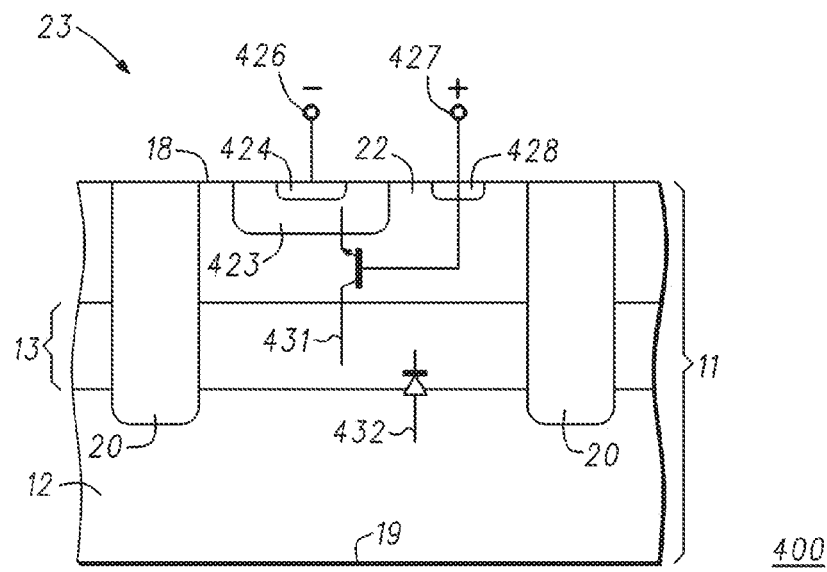
FIG. 4 illustrates an enlarged partial cross-sectional view of a still further embodiment of a semiconductor device in accordance with the present invention.

FIG. 4 illustrates an enlarged partial cross-sectional view of a device 400, semiconductor device structure 400, or semiconductor device 400 using self-isolating bulk semiconductor substrate 11 in accordance with another embodiment. In this embodiment, functional device 23 is illustrated within p-type doped region 22 as an n-type region 423 and an n-type contact region disposed within n-type region 423. Functional device 23 further includes a p-type doped region 428 laterally spaced apart from n-type doped region 423. By way of example, with a positive bias 427 placed on p-type doped region 428 and a negative bias 426 placed on n-type contact region 424, FIG. 4 illustrates a bipolar effect that creates an NPN transistor 431 with n-type floating buried doped region 13 that functions to pull n-type floating buried doped region 13 towards the potential of n-type region 423. In accordance with the present embodiment, NPN transistor 431 pulls the cathode of diode 432 formed between n-type floating buried doped region 13 and p-type semiconductor region 12 toward negative bias 426. In this example, the potential on semiconductor region 12 is clamped at a voltage less than the voltage on n-type floating buried doped region 13 plus the forward voltage drop of the diode between p-type semiconductor region 12 and n-type floating buried doped region 13. In one embodiment, the potential of other n-type floating buried doped regions 13 disposed in other unrelated device pockets is above the potential of p-type semiconductor region 12.

Figure 5:
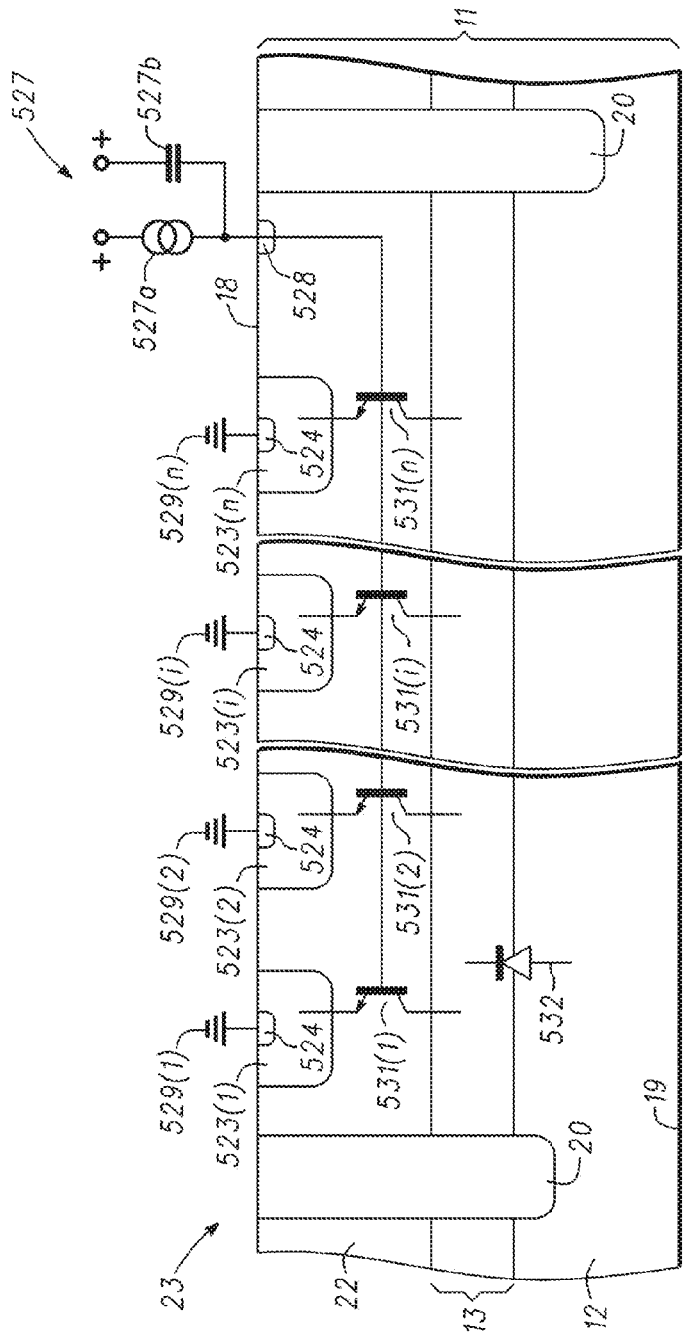
FIG. 5 illustrates an enlarged partial cross-sectional view of another embodiment of a semiconductor device in accordance with the present invention.

FIG. 5 illustrates an enlarged partial cross-sectional view of a device 500, semiconductor device structure 500, or semiconductor device 500 using self-isolating bulk semiconductor substrate 11 in accordance with a further embodiment. In this embodiment, functional device 23 is illustrated within doped region 22 as a plurality of n-type regions 523(1)-523(n) with an n-type contact region 524 disposed within each of the n-type regions 523(1)-523(n). Functional device 23 further includes a p-type doped region 528 disposed within p-type doped region 22 and laterally spaced apart from the n-type doped regions 523. By way of example, a positive bias 527 is placed on p-type doped region 528 using, for example, a current source 527a or a capacitor 527b. Additionally, each of the n-type regions 523(1)-523(n) is placed at a ground potential 529(1)-529(n). FIG. 5 illustrates a bipolar effect that creates NPN transistor 531(1)-531(n) with n-type floating buried doped region 13 that functions to pull n-type floating buried doped region 13 towards the potential of the n-type region 523(1)-523(n)

having the lowest potential. In accordance with the present embodiment, the NPN transistor 531(1)-531(n) pulls the cathode of diode 532 formed between n-type floating buried doped region 13 and p-type semiconductor region 12 toward the lowest ground among 529(1)-529(n). In this example, the potential on semiconductor region 12 is clamped at a voltage less than the voltage on floating buried region 13 plus the forward voltage drop of the diode between p-type semiconductor region 12 and n-type floating buried doped region 13.

Figure 6:
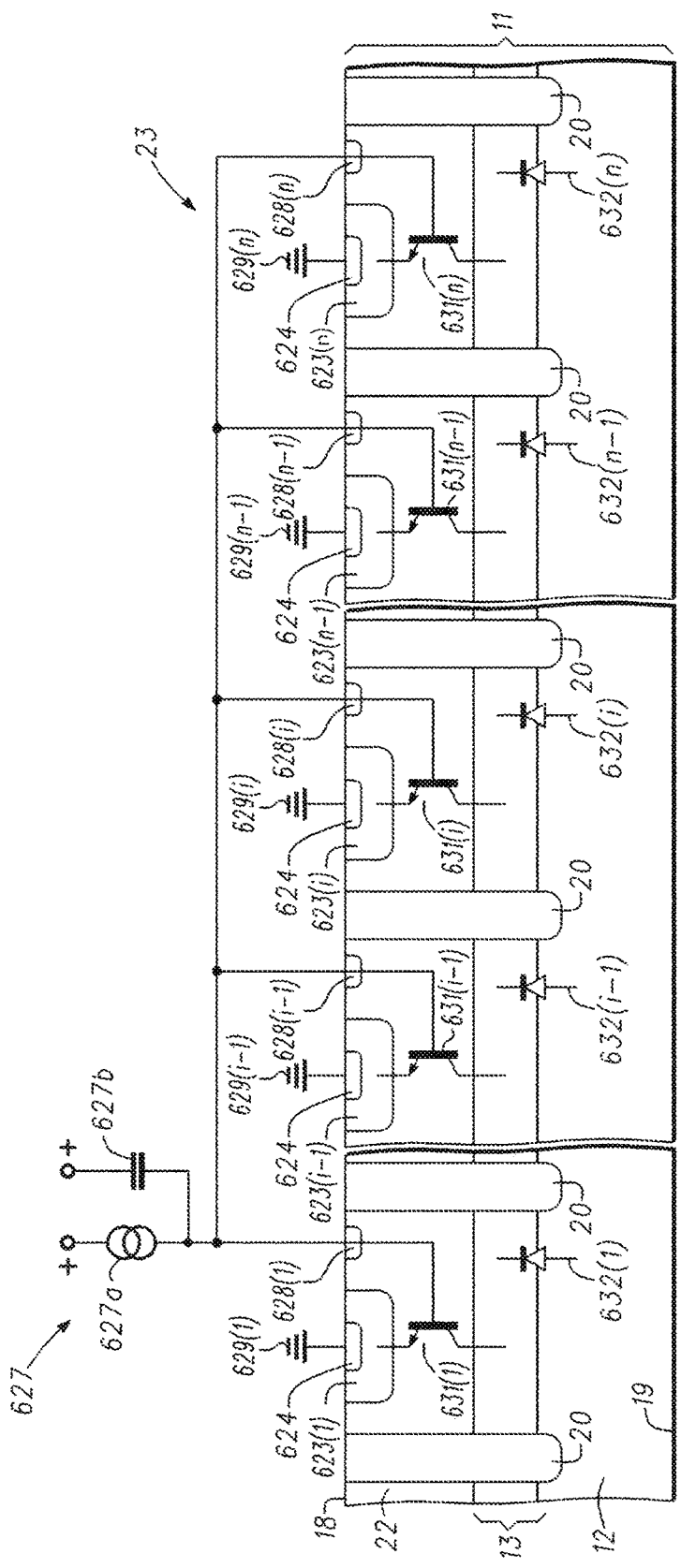
FIG. 6 illustrates an enlarged partial cross-sectional view of a further embodiment of a semiconductor device in accordance with the present invention.

FIG. 6 illustrates an enlarged partial cross-sectional view of a device 600, semiconductor device structure 600, or semiconductor device 600 using self-isolating bulk semiconductor substrate 11 in accordance with a still further embodiment. In this embodiment, functional device 23 is illustrated within a plurality doped regions 22 as a plurality of n-type regions 623(1)-623(n) with an n-type contact region 624 disposed within each of the n-type regions 623(1)-623(n). Functional device 23 further includes a plurality of p-type doped regions 628(1)-628(n) each disposed within a respective p-type doped region 22 and laterally spaced apart from a respective n-type doped region 623(1)-623(n). By way of example, a positive bias 627 is placed on each of the p-type doped regions 628(1)-628(n) using, for example, a current source 627a or a capacitor 627b. Additionally, each of the n-type regions 623(1)-623(n) is placed at a ground potential 629(1)-629(n). FIG. 6 illustrates a bipolar effect that creates NPN transistors 631(1)-631(n) with n-type floating buried doped region 13 that functions to pull n-type floating buried doped region 13 towards the potential of its respective n-type region 623(1)-623(n). In accordance with the present embodiment, the NPN transistor 631(1)-631(n) pulls the cathode of diodes 632 formed between n-type floating buried doped region 13 and p-type semiconductor region 12 toward the lowest ground among 629(1)-629(n). In this example, the potential on semiconductor region 12 is clamped to the minimum potential of the n-type doped 623(1)-623(n) plus the forward voltage drop of the diode between p-type semiconductor region 12 and n-type floating buried doped region 13.

Figure 7:
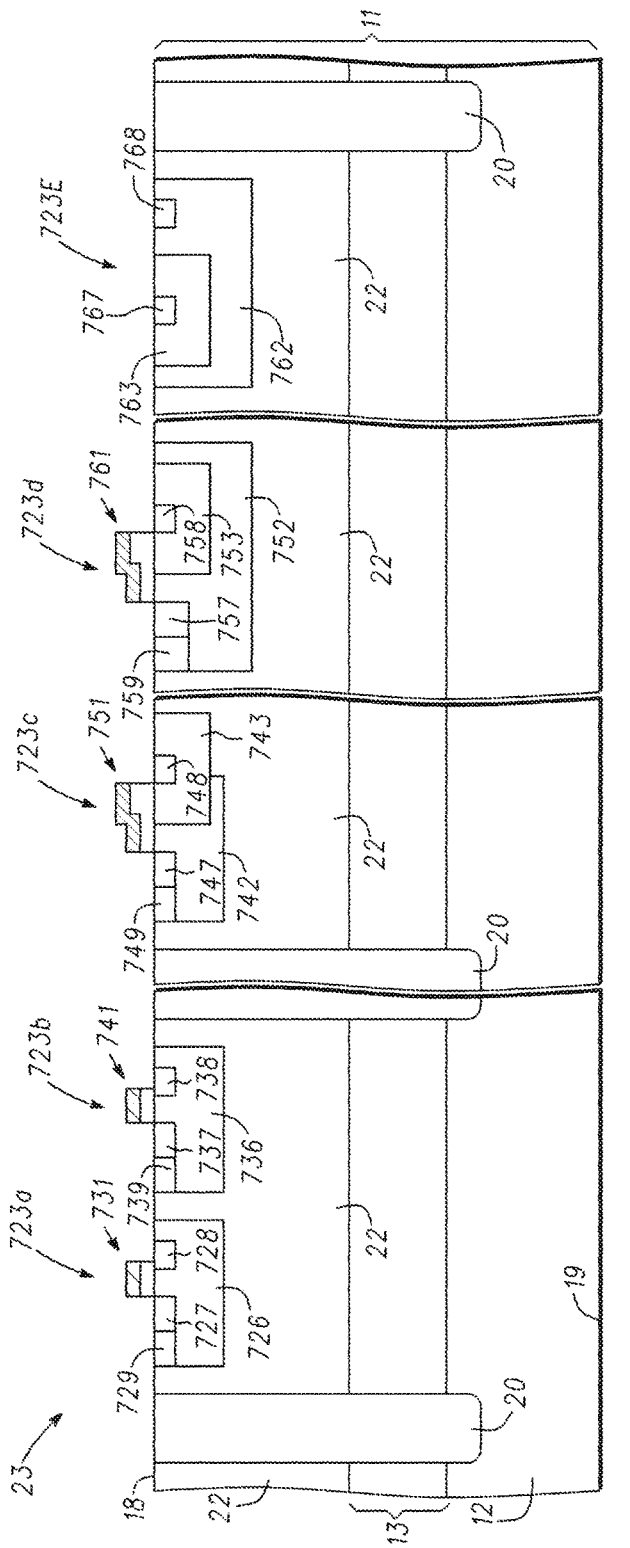
FIG. 7 illustrates an enlarged partial cross-sectional view of a still further embodiment of a semiconductor device in accordance with the present invention.

FIG. 7 illustrates an enlarged partial cross-sectional view of a device 700, semiconductor device structure 700, or semiconductor device 700 using self-isolating bulk semiconductor substrate 11 in accordance with a still further embodiment. In this embodiment, various functional devices 23 are illustrated including, for example, an NMOS device 723a, a PMOS device 723b, an NDMOS 723c, a PDMOS device 723d, and a diode device 723e disposed within p-type doped region 22 and extending from major surface 18. In accordance with the present embodiment, the various functional devices are laterally isolated by isolation structures 20 and further isolated vertically by floating buried n-type region 13 as described previously. Although not illustrated, it is understood that additional isolation structures 20 can be used to separate each or groups of functional devices 723a-723e. Likewise, it is understood that groups of functional devices 723a-723e can be disposed within the confines of a given device pocket laterally bounded by isolation structures 20. By way of example, NMOS device 723a includes a p-well region 726, a pair of spaced-apart current carrying n-type regions 727 and 728, a p-type contact 729, and an insulated control electrode 731. PMOS device 723b includes an n-well region 736, a pair of spaced-apart current carrying p-type regions 737 and 738, an n-type contact 739, and an insulated control electrode 741. In some embodiments NMOS device 723a and PMOS device 723b are among a plurality of such devices configured as CMOS devices and further configured in desired circuitry for device 700. NDMOS device 723c includes a p-well 742, an n-drift region 743, a pair of spaced-apart n-type current carrying regions 747 and 748, a p-type contact 749, and an insulated control electrode 751. PDMOS device 723d includes an n-well 752, a p-drift region 753, a pair of spaced-apart p-type current carrying regions 757 and 758, an n-type contact 759, and an insulated control electrode 761. NDMOS device 723c and PDMOS device 723d are examples of power transistor devices that can be integrated with NMOS device 723a and PMOS device 723b in a smart power configuration. Diode device 723e includes an n-well 762, a p-drift region 763, a p-type current carrying region 767, and an n-type current carrying region 768. As shown in FIG. 7, semiconductor device 700 and self-isolating bulk semiconductor substrate 11 are provided or formed absent, without, or free from any diffused contact or trench contact regions making direct contract to n-type floating buried doped region 13. This configuration permits floating buried doped region 13 to be free of any direct biasing or applied external bias. Further, semiconductor device 700 and self-isolating bulk semiconductor substrate 11 are advantageously provided or formed absent any buried oxide layers or SOI regions that vertically separate p-type doped region 22 from semiconductor region 12.

FIG. 8 illustrates an enlarged partial cross-sectional view of a device 800, semiconductor device structure 800, or semiconductor device 800 using self-isolating bulk semiconductor substrate 11 in accordance with another embodiment. In this embodiment, various functional devices 23 are illustrated including, for example, an NMOS device 823a and a PMOS device 823b disposed within a p-type doped portion 22a of p-type doped region 22 and extending from major surface 18. In accordance with the present embodiment, the various functional devices are laterally isolated by isolation structures 20 and further isolated vertically by floating buried n-type region 13 as described previously. By way of example, NMOS device 823a includes a p-well region 825, a pair of spaced-apart current carrying n-type regions 827 and 828, a p-type contact 829, and an insulated control electrode 831. PMOS device 823b includes an n-well region 836, a pair of spaced-apart current carrying p-type regions 837 and 838, an n-type contact 839, and an insulated control electrode 841. In some embodiments NMOS device 823a and PMOS device 823b are among a plurality of such devices configured as CMOS devices and further configured in desired circuitry for device 800. In accordance with the present embodiment, device 800 further includes an n-type shielding structure 826, which is disposed within p-type doped region 22 (separating p-type doped region 22 into regions 22(a) and 22(b)) and encloses laterally and vertically the functional devices 23, which are embedded into p-type doped region 22(a). In one embodiment, shielding structure 826 includes an n-type buried layer portion 8261 and an n-type sinker portion 8262 physically contacting n-type buried layer portion 8261. In one embodiment, shielding structure 826 includes an n-type resurf portion 8261 and an n-type sinker portion 8262 physically contacting n-type resurf layer portion 8261. In one embodiment, n-type shielding structure is vertically spaced apart from n-type floating buried doped region 13. In accordance with the present embodiment shielding structure 826 is configured to avoid or reduce electron injection from n-type floating buried doped region 13 into the drain regions of, for example, the NMOS devices thereby further improving the performance of the functional devices 23.

In summary, the self-isolating bulk semiconductor substrate 11 has several advantages over prior substrates used in semiconductor technologies, such as smart power technologies. For example, semiconductor substrate 11 has more compact p-type doped regions 22 compared to previous bulk substrates using diffused sinker or other contact structure processes. This provides for advantageous device area gains. Also, the functional device 23 disposed within p-type doped regions 22 can freely float positive and negative versus semiconductor region 12. More particularly, the self-biasing characteristics of n-type floating buried doped region 13 functions so that the p-type doped region 22/n-type floating buried doped region 13/semiconductor region 12 vertical stack behaves similar to an SOI substrate within the constraints of the junction breakdown limits. Additionally, semiconductor substrate 11 has lower costs compared to previous bulk substrates by eliminating the sinker technology and SOI technology. In addition, semiconductor substrate 11 eliminates an inherent high gain lateral parasitic bipolar transistor present in bulk substrates using sinker technologies. Further, the junction between p-type doped region 22 and n-type floating buried layer region 13 behaves more like a one-dimensional junction, which increases breakdown performance. Moreover, semiconductor substrate 11 has higher thermal conductivity performance and less capacitive coupling compared to SOI substrates.

In a further embodiment, the self-isolating bulk semiconductor substrate consists essentially of a floating buried doped region of a first conductivity type, a doped region of a second conductivity type disposed between the floating buried doped region and the first major surface, and a semiconductor region of the second conductivity type disposed between the floating buried doped region and the second major surface.

From all of the foregoing one skilled in the art can determine that according to one embodiment, a method of making a semiconductor device comprises providing a self-isolating bulk semiconductor substrate having first and second opposing major surfaces. The self-isolating bulk semiconductor substrate includes a floating buried doped region of a first conductivity type, a doped region of a second conductivity type disposed between the floating buried doped region and the first major surface, and a semiconductor region of the second conductivity type disposed between the floating buried doped region and the second major surface. The method includes forming a trench isolation region extending from the first major surface through the doped region, extending through the floating buried doped region, and extending into the semiconductor region, wherein the floating buried doped region abuts the trench isolation region. The method includes forming semiconductor device disposed within the doped region.

In view of the above, it is evident that a novel device structure and method is disclosed. Included, among other features, is providing a self-isolating bulk semiconductor substrate that includes a floating buried doped region of a first conductivity type disposed between a doped region of a second conductivity type and a semiconductor region of the second conductivity type. In one embodiment, the first conductivity type is n-type and the second conductivity type is p-type. A trench isolation structure is provided that extends through the doped region and the floating buried doped region and extends into the semiconductor region to provide a one or more active device regions. The floating buried doped region abuts or adjoins the trench isolation structure and is provided absent any structures that provide direct ohmic or direct low-ohmic electrical contact to it. Instead, the floating buried doped is biased by the biases placed on the adjacent regions. The structure and method provide a semiconductor device having improved area use and improved thermal characteristics and electrical characteristics compared to prior structures and methods.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method for forming a semiconductor device structure comprising:
   providing a self-isolating bulk semiconductor substrate having first and second opposing major surfaces, wherein the self-isolating bulk semiconductor substrate comprises:
     a floating buried doped region of a first conductivity type;
     a doped region of a second conductivity type opposite to the first conductivity type disposed between the floating buried doped region and the first major surface, wherein the doped region abuts the floating buried doped region; and
     a semiconductor region of the second conductivity type disposed between the floating buried doped region and the second major surface;
   providing a trench isolation region extending from the first major surface through the doped region, extending through the floating buried doped region, and extending into the semiconductor region, wherein the floating buried doped region abuts the trench isolation region; and
   providing a semiconductor device disposed within the doped region.

2. The method of claim 1, wherein providing the self-isolating bulk substrate comprises providing the doped region and the semiconductor region absent any diffused contact structures or conductive contact structures making direct or low-ohmic contact to the floating buried doped region.

3. The method of claim 2, wherein providing the self-isolating bulk semiconductor substrate comprises providing the self-isolating bulk substrate absent any laterally extending buried oxides or SOI structures that partially or completely vertically separate the doped region from the semiconductor region.

4. The method of claim 1, wherein providing the self-isolating bulk substrate comprises providing the floating buried doped region having a varying dopant concentration.

5. The method of claim 4, wherein providing the floating buried doped region comprises:
   providing a first region adjoining the doped region; and providing a second region disposed between the first region and the semiconductor region, wherein the first region has a lower dopant concentration than the second region.

6. The method of claim 5, wherein providing the floating buried doped region further comprises providing a third region disposed between the second region and the semiconductor region, wherein the third region has a lower dopant concentration than the second region.

7. The method of claim 1, wherein providing the semiconductor device comprises a forming power MOS device.

8. The method of claim 1 further comprising forming a shielding structure disposed within the doped region laterally and vertically enclosing the semiconductor device.

9. The method of claim 8, wherein:
forming the shielding structure comprises:
   forming a buried layer portion of the first conductivity type disposed between the floating buried doped region and the semiconductor device; and
   forming a sinker portion of the first conductivity type laterally disposed between the trench isolation region and the semiconductor device, wherein the sinker portion physically contacts the buried layer portion of the shielding structure; and
providing the semiconductor device comprises forming s a CMOS device.

10. The method of claim 1, wherein providing the semiconductor device comprises forming at least one second doped region of the first conductivity type extending from the first major surface into the doped region and vertically separated from the floating buried doped region by the doped region.

11. A semiconductor device structure comprising:
a bulk semiconductor substrate having first and second opposing major surfaces, wherein the bulk semiconductor substrate comprises:
   a floating buried doped region of a first conductivity type;
   a doped region of a second conductivity type opposite to the first conductivity type disposed between the floating buried doped region and the first major surface, and wherein the doped region abuts the floating buried doped region; and
   a semiconductor region of the second conductivity type disposed between the floating buried doped region and the second major surface;
an isolation trench having a pair of laterally separated isolation trench portions in a cross-sectional view extending from the first major surface through the doped region, extending through the floating buried doped region, and extending into the semiconductor region, and wherein the floating buried doped region abuts the pair of laterally separated isolation trench portions in the cross-sectional view; and
a semiconductor device disposed within the doped region between the pair of laterally separated isolation trench portions, wherein:
the isolation trench comprises:
   a trench;
   a dielectric material lining surfaces of the trench; and
   a conductive material disposed adjacent the dielectric material, wherein the dielectric material physically separates the conductive material from the bulk semiconductor substrate.

12. The structure of claim 11, wherein the bulk semiconductor substrate is provided absent any laterally extending buried oxides or SOI structures that partially or completely vertically separate the doped region from the semiconductor region.

13. The structure of claim 11, wherein the floating buried doped region comprises:
a first region adjoining the doped region;
a second region disposed between the first region and the semiconductor region, wherein the first region has a lower dopant concentration than the second region; and
a third region disposed between the second region and the semiconductor region, wherein the third region has a lower dopant concentration than the second region.

14. The structure of claim 11 further comprising a shielding structure disposed within the doped region laterally and vertically enclosing the semiconductor device, wherein the shielding structure comprises:
a buried layer portion of the first conductivity type disposed between the floating buried doped region and the semiconductor device; and
a sinker portion of the first conductivity type laterally disposed between the pair of laterally separated isolation trench portions in the cross-sectional view and the semiconductor device, wherein the sinker portion physically contacts the buried layer portion of the shielding structure.

15. The structure of claim 11, wherein the doped region and the semiconductor region are provided absent any diffused contact structures or conductive contact structures making direct or low-ohmic contact to the floating buried doped region.

16. A method for forming a semiconductor device structure, comprising:
providing a self-isolating bulk semiconductor substrate having first and second opposing major surfaces, wherein the self-isolating bulk semiconductor substrate comprises:
   a floating buried doped region of a first conductivity type;
   a doped region of a second conductivity type opposite to the first conductivity type disposed between the floating buried doped region and the first major surface, wherein the doped region abuts the floating buried doped region; and
   a semiconductor region of the second conductivity type disposed between the floating buried doped region and the second major surface;
providing an isolation trench having a pair of laterally separated isolation trench portions in a cross-sectional view extending from the first major surface through the doped region, extending through the floating buried doped region, and extending into the semiconductor region, and wherein the floating buried doped region abuts the pair of laterally separated isolation trench portions in the cross-sectional view; and
providing a semiconductor device disposed within the doped region.

17. The method of claim 16, wherein providing the isolation trench comprises:
providing a trench;
providing a dielectric material lining surfaces of the trench; and
providing a conductive material disposed adjacent the dielectric material, wherein the dielectric material physically separates the conductive material from the bulk semiconductor substrate.

18. The method of claim 16, wherein providing the self-isolating bulk semiconductor substrate comprises providing the floating buried doped region comprising:
- a first region adjoining the doped region; and
- a second region disposed between the first region and the semiconductor region, wherein the first region has a lower dopant concentration than the second region.

19. The method of claim 16 further comprising forming a shielding structure disposed within the doped region laterally and vertically enclosing the semiconductor device.

20. The method of claim 16, wherein providing the semiconductor device comprises forming at least one second doped region of the first conductivity type extending from the first major surface into the doped region and vertically separated from the floating buried doped region by the doped region.

* * * * *